United States Patent [19]
Obermeier

[11] Patent Number: 5,565,698
[45] Date of Patent: Oct. 15, 1996

[54] IC PROTECTION STRUCTURE HAVING N-CHANNEL MOSFET WITH N-TYPE RESISTOR REGION

[75] Inventor: Cornelius Obermeier, March-Buchheim, Germany

[73] Assignee: Deutsche Itt Industries GmbH, Freiburg, Germany

[21] Appl. No.: 498,822

[22] Filed: Jul. 6, 1995

[30] Foreign Application Priority Data

Jul. 4, 1994 [DE] Germany ............................ 44 23 591.7

[51] Int. Cl.$^6$ ............................ H01L 23/60; H01L 27/06
[52] U.S. Cl. .......................... 257/360; 257/358; 257/363; 257/355; 257/536
[58] Field of Search ...................... 257/355, 565, 257/357, 356, 358, 360, 363, 364, 536

[56] References Cited

U.S. PATENT DOCUMENTS

| | | | |
|---|---|---|---|
| 4,246,592 | 1/1981 | Bartlett | 257/904 |
| 4,691,217 | 9/1987 | Ueno et al. | 257/359 |
| 4,902,640 | 2/1990 | Sachitano et al. | 257/370 |
| 4,987,465 | 1/1991 | Longcor et al. | 257/357 |
| 5,270,565 | 12/1993 | Lee et al. | 257/355 |
| 5,371,395 | 12/1994 | Hawkins | 257/356 |
| 5,426,322 | 6/1995 | Shiota | 257/355 |
| 5,440,162 | 8/1995 | Worley et al. | 457/536 |

OTHER PUBLICATIONS

A Synthesis of ESD Input Protection Scheme, Charvaka Duvvury and Robert Rountree, pp. 88–97, 1991 EOS/ESD Symposium Proceedings.

Primary Examiner—Robert P. Limanek
Assistant Examiner—Alexander Oscar Williams
Attorney, Agent, or Firm—Plevy & Associates

[57] ABSTRACT

A protection structure for integrated circuits with an n-channel MOS field-effect transistor has a more stable bipolar state, with the change to the bipolar state occurring fast. Below the drain region and the drain contact region an n-type resistor region doped more lightly than the drain region and the drain contact region is formed to provide the electrically conductive connection between the drain region and the drain contact region. When a positive voltage pulse is applied to the drain contact region, the n-channel MOS transistor will go into a bipolar operating state upon reaching the drain-source or drain-substrate breakdown voltage. The conductor paths are typically connected to ground. The n-well forms a series resistor between the drain region and the drain contact region of the respective transistor. It also forms a pn junction between the drain region and the channel, the collector pn junction, which extends deep into the substrate. Because of the series resistance of this n-well, during the change to the bipolar state, contractions of the current occurring at the pn junction are prevented. In the bipolar state, the transistor can absorb more power than with conventional arrangements. By connecting two or more transistors in parallel, the current is distributed even further, so that the power can be absorbed by both transistors, since the dissipation is distributed over an even larger area.

20 Claims, 2 Drawing Sheets

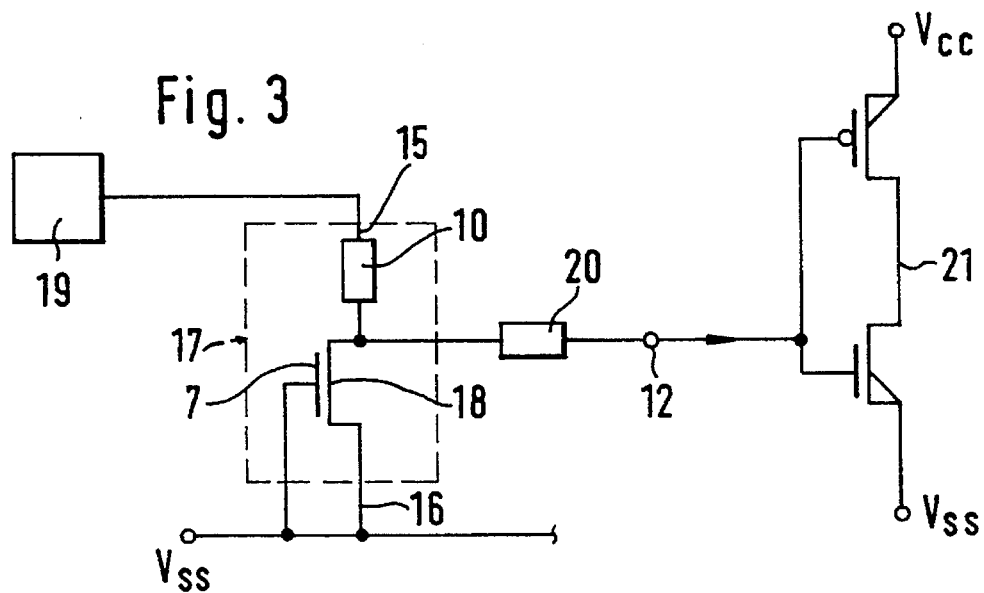
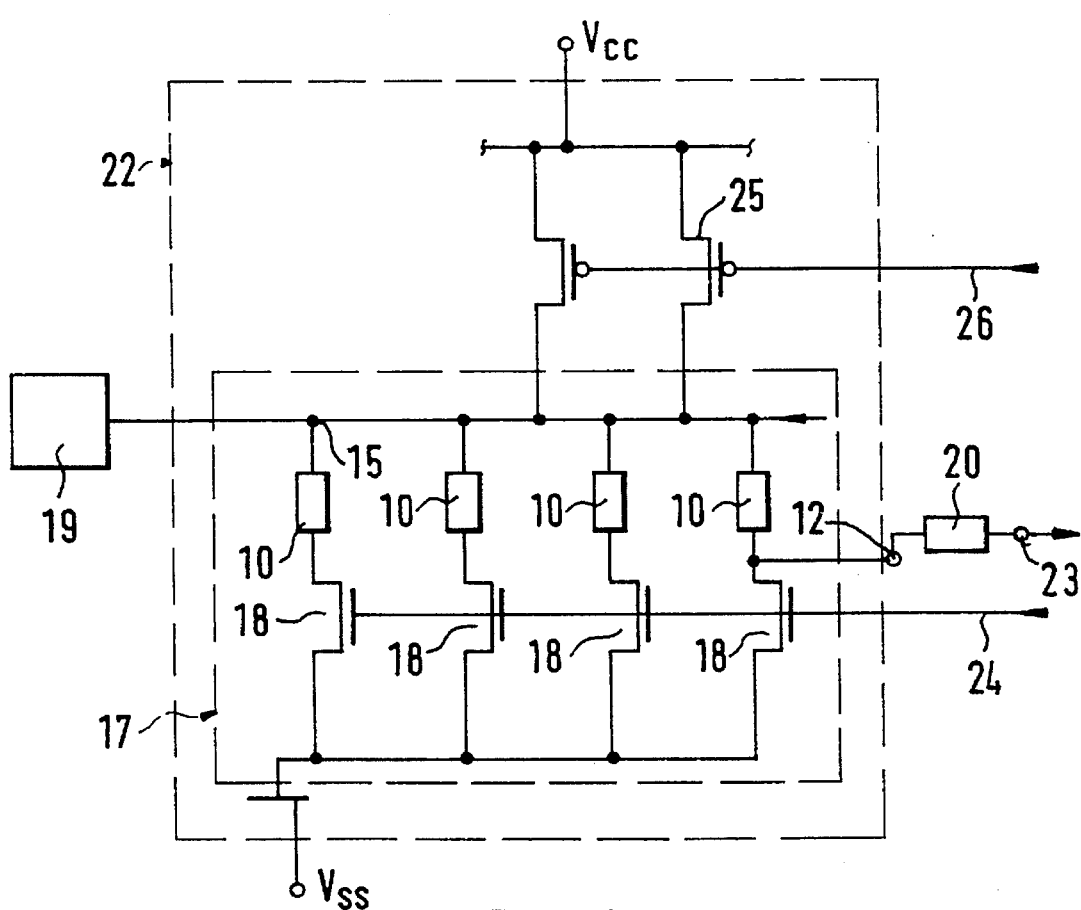

IC PROTECTION STRUCTURE HAVING N-CHANNEL MOSFET WITH N-TYPE RESISTOR REGION

FIELD OF THE INVENTION

The present invention relates generally to a semiconductor device, and more particularly to an integrated circuit protection structure.

BACKGROUND OF THE INVENTION

The electrostatic discharge sensitivity of MOS devices has been well known for the past 30 years. Electrostatic discharge currents may reach the pins during handling of the IC as a result of discharge of charged objects, e.g. through a person, through metal tools, through a case, etc. In order to prevent the electrostatic destruction of the gate insulator film of a MOS element various protection circuits have been proposed. A protective circuit typically is connected between an internal circuit and a bonding pad to which a signal is applied. The protective circuit blunts the abnormal input energy by.

U.S. Pat. No. 4,691,217 entitled "Semiconductor Integrated Circuit Device", issued to Tatsuaki Ueno et al. on Sep. 1, 1987 discloses a semiconductor integrated circuit device protective circuit which includes a MOSFET connected as a diode and a resistor.

An article entitled "A Synthesis Of ESD Input Protection Scheme" by Charvaka Duvvury et al., published in EOS/ESD Symposium Proceedings 1991, describes input protection for CMOS technologies consisting of primary and secondary protection devices. A protection arrangement for integrated circuits (ICs) utilizes an n-channel MOS field-effect transistor (transistor) which is designed to protect the inputs or the outputs of the IC against electrostatic discharge overloading. In order to accomplish this protection, the transistor which is connected to the pin via the bonding pad, i.e., to the respective input or output of the IC, and which always contains a parasitic bipolar transistor, is changed to the bipolar state, in which it can be operated with a high current at a lower voltage. This operation in the bipolar state is referred to as "snapback". Because of the voltage reduction in the bipolar mode, the transistor can absorb more power. To provide further protection for the transistor, the change to the bipolar state should be as fast as possible and the bipolar state should be kept as stable as possible, since a second "snapback", a "second breakdown" of the bipolar transistor, would destroy the latter.

It is the object of the present invention to improve the protection structure so that the bipolar state of the transistor is more stable while the change to the bipolar state is still fast.

SUMMARY OF THE INVENTION

The present invention is a protection structure for integrated circuits with an n-channel MOS field-effect transistor having a more stable bipolar state, with the change to the bipolar state occurring fast. Below the drain region and the drain contact region an n-type resistor region doped more lightly than the drain region and the drain contact region is formed to provide the electrically conductive connection between the drain region and the drain contact region.

When a positive voltage pulse is applied to the drain contact region, the n-channel MOS transistor will go into a bipolar operating state upon reaching the drain-source or drain-substrate breakdown voltage. The conductor paths are typically connected to ground. The n-well forms a series resistor between the drain region and the drain contact region of the respective transistor. It also forms a pn junction between the drain region and the channel, the collector pn junction, which extends deep into the substrate. Because of the series resistance of this n-well, during the change to the bipolar state, contractions of the current occurring at the pn junction are prevented. In the bipolar state, the transistor can absorb more power than with conventional arrangements. By connecting two or more transistors in parallel, the current is distributed even further, so that the power can be absorbed by both transistors, since the dissipation is distributed over an even larger area.

BRIEF DESCRIPTION OF THE DRAWING

For a full understanding of the present invention, the above objects and further features and advantages of the invention are described in detail in an exemplary embodiment below in conjunction with the drawing, for which:

FIG. 3 is a schematic of the present invention used in the input portion of an IC;

FIG. 4 is a schematic of the present invention used in the output portion of an IC.

DETAILED DESCRIPTION OF THE INVENTION

Figure 1:
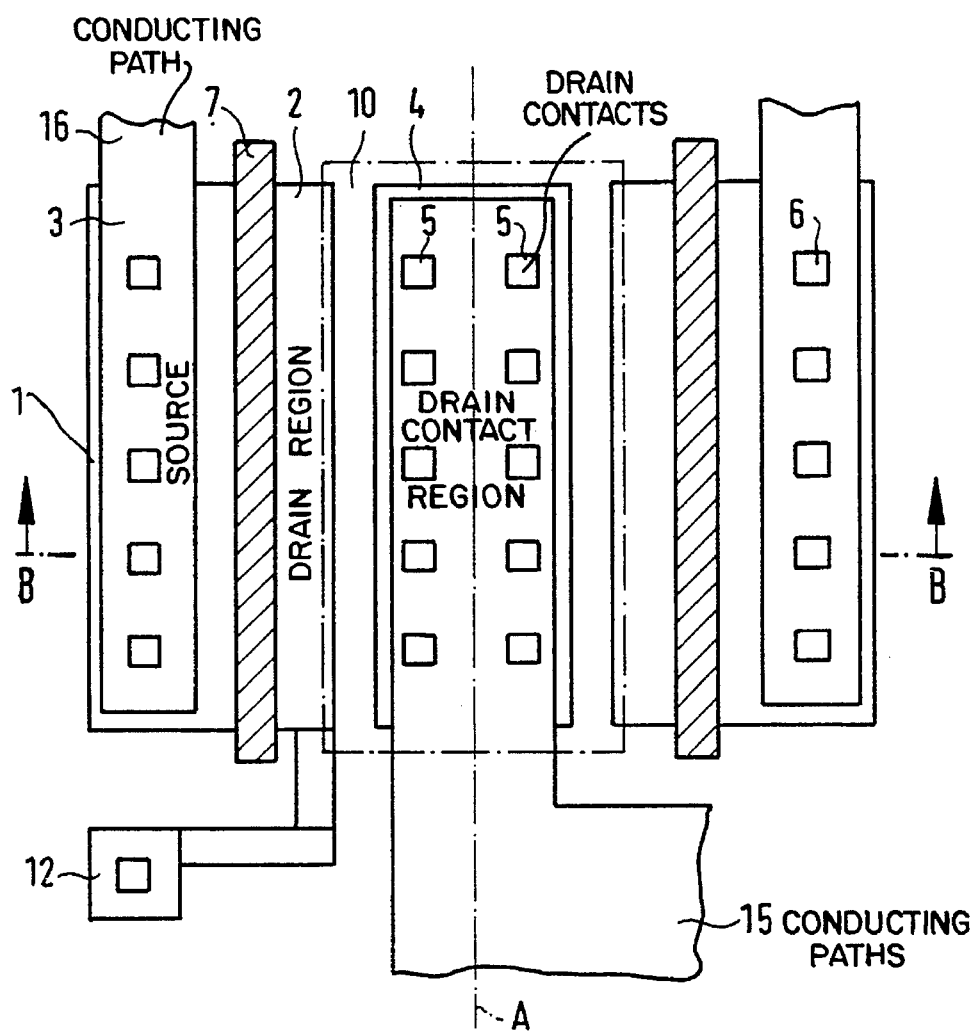
FIG. 1 is a top view of an arrangement of two parallel-connected transistors in accordance with the invention.

A protection arrangement for integrated circuits (ICs) with an n-channel MOS field-effect transistor (transistor) which is designed to protect the inputs or the outputs of the IC against electrostatic discharge overloading is described in an article entitled "A Synthesis Of ESD Input Protection Scheme" by Charvaka Duvvury et al., published in EOS/ESD Symposium Proceedings 1991. In order to accomplish this protection, the transistor which is connected to the pin, i.e., to the respective input or output of the IC, and which always contains a parasitic bipolar transistor, is changed to the bipolar state, in which it can be operated with a high current at a lower voltage. This operation in the bipolar state is referred to as "snapback". Because of the voltage reduction in the bipolar mode, the transistor can absorb more power. To provide further protection for the transistor, the change to the bipolar state should be as fast as possible and the bipolar state should be kept as stable as possible, since a second "snapback", a "second breakdown" of the bipolar transistor, would destroy the latter.

It is desirable to improve the protection structure so that the bipolar state of the transistor is more stable and that the change to the bipolar state is still fast. The present invention achieves this improvement by providing below the drain region and the drain contact region an n-type resistor region doped more lightly than the drain region and the drain contact region so as to provide the electrically conductive connection between the drain region and the drain contact region.

In this arrangement, like in conventional n-channel MOS transistors, the drain-gate edge is formed by a shallow, heavily doped pn junction. This ensures a low breakdown voltage for the change to the bipolar mode, i.e., for snapback, which this occurs fast. Because of the n-type resistor region provided in accordance with the invention, this more lightly doped resistor region extends further into the interior of the substrate near the drain edge. This eliminates the risk of thermal overloading during the change to the bipolar state. This is explained by the fact that at the breakdown voltage, current contractions occur at the pn junction which now distribute along the drain/gate edge. Also, spurious thermal effects of the metal contacts in the drain contact region on the drain region and, thus, on the operation of the transistor are prevented, since, because of the transistor region, there is a great drain/gate edge-to-contact spacing, so that heat conduction to the contacts takes place over a greater distance. Between the drain region and the drain contact region there is provided, at the surface of the substrate, an n-type resistor region which is not bridged with the n-type dopants of the drain region and the drain contact region. The drain region and the drain contact region may be n-type doped at the same level. In addition to the advantage that local overheating ("hot spots") during the change to the bipolar state of the transistor is prevented, a very space-saving arrangement is obtained, since no additional resistor element need be provided, because the resistor region is incorporated into the substrate. Furthermore, the n-channel transistor can be fabricated without additional steps and without additional masks by the normal MOS process for manufacturing the IC.

In a preferred embodiment of the invention, the resistor region does not extend farther than the gate/drain edge of the drain region. This provides good coupling of the resistor region to the drain region and makes it possible to cover as large an area of the drain region as possible, the drain region being limited by the fact that the size of the channel formed below the gate electrode between the source region and the drain region is not affected. Advantageously, the resistor region extends below the entire drain contact region, so that good contact is ensured between the resistor region and the drain contact region. Advantageously, the width of the resistor region is greater than 10 μm, preferable 100 μm. Compared with the usual dimensions of high-performance n-channel MOS transistors, this provides a good value. The width of the resistor region is then slightly greater than the width of the transistors. It is advantageous to use the n-well of the CMOS process as the resistor region.

It is also advantageous if the depth of the resistor region is substantially greater than the depth of the drain region or drain contact region, by a factor of at least 1.5 and preferably by a factor of 3 to 5. The depth can be chosen in accordance with the desired function of the individual transistors.

In another preferred embodiment of the invention, there may be provided an n-type region below the source region which is doped more lightly than the source region. Thus, at that place, too, the occurrence of short circuits due to alloying effects because of the metallic electrode leads is prevented.

Also, the drain region may be connected via a contact directly to an input element, particularly a gate electrode, of an input transistor of the IC to be protected.

The protection against electrostatic charging provided by the arrangement of the present invention is also effective with transistors having very shallow source and drain contacts, which are used in high-speed circuits. Such transistors can also be implemented and used to advantage in silicided technologies. This applies both if only one of the gate, source, and drain regions is silicided and if all of these regions are silicided. In the case of such transistors, a transistor designed in accordance with the invention is particularly advantageous, because silicided regions have very low resistivity, so that normally such transistors are particularly vulnerable under electrostatic conditions. Here, the protection provided by the resistor region is particularly effective.

The present invention can be used to protect the output of an IC. It may then itself form the output stage of the IC, so that no separate component is required for the protection device. Space can thus be saved in the chip technology used. The present invention finds use, for example, as open-drain output, as part of a push-pull stage, and in combined outputs and inputs in CMOS technology. To protect an input of an IC, the terminal of the drain region of the protection structure is connected via a low-resistivity path to an input element, such as a gate electrode of a transistor, with the gate electrode connected to the source potential, commonly ground potential. The protection structure according to the invention is also used between supply leads, particularly between the positive supply lead and ground, of an IC or of a subcircuit of an IC.

Referring to FIG. 1, there can be seen on a p-type substrate 1 a drain region 2 and a source region 3 are provided for each of the two n-channel transistors. Also provided is a drain contact region 4, which is separate from the drain regions 2 and can be used for both transistors together. The drain contact region 4 is provided with drain contacts 5 for both transistors. The source contacts 6 are provided on the respective source regions 3 of the two transistors. Between the drain region 2 and the source region 3 of each of the transistors, a gate electrode 7 is provided on an insulating layer 8. A field-oxide layer 9 disposed between the drain region 2 and the drain contact region 4 of each transistor isolates the drain region 2 from the drain contact region 4. The arrangement of the two transistors is symmetrical about the axis of symmetry A. To make contact to the drain contacts 5 and the source contacts 6, conducting paths 15 and 16 are deposited on the drain and source regions, respectively. The conducting paths are typically of aluminum, and lead to a pad.

Figure 2:
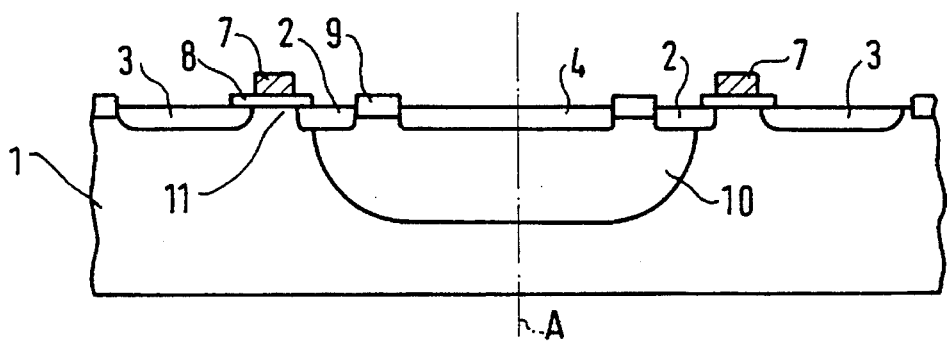
FIG. 2 is a is a cross section of the arrangement of FIG. 1 through cut B—B.

Referring to FIG. 2, there is shown a cross section of the present invention through cut B—B. Below the drain regions 2 and the drain contact region 4 there is an n-well 10 which is doped more lightly than the drain regions 2 and the drain contact region 4. Since the drain regions 2 are isolated from the drain contact region 4 by the field-oxide layer 9, electrical conduction between the drain regions 2 and the drain contact region 4 takes place via the n-well 10. The n-well 10 extends below the entire drain contact region 4 to the vicinity of the respective gate/drain edges of the drain regions 2. This ensures good contact between the n-well and the drain regions 2 as well as the drain contact region 4. The n-well 10 does not quite reach to the gate/drain edge, so that the channel 11 existing in each transistor between the drain region 2 and the source region 3 below the gate electrode 7 is not narrowed by the n-well 10. The n-well 10 further extends into the substrate 1 by a multiple of the depth of the drain region 2, so that the pn junction is moved further into the interior of the substrate. This creates a deeper, but more lightly doped pn junction than that between the drain region 2 and the channel region 11. Via a contact pad 12 the protective arrangement is connected to an input element of the IC, such as a gate electrode of an input transistor.

FIG. 3 shows the use of the protection structure according to the invention in the input portion of an IC. The protection structure 17 shows a transistor 18 connected in series with the resistor formed by the resistor region 10. A conductor path 15 connected to thee drain contact region leads to an external pad 19, via which the IC can be connected to external connections. The transistor 18 is connected as a diode, with a conductor path 16 from the source terminal and the gate electrode 7 connected to a first fixed potential $V_{ss}$, preferably ground. The drain region of the transistor 18 has its terminal 12 connected to an input element 21 of the IC, i.e., of the internal part of the IC which is connected to a first fixed potential $V_{ss}$ and a second fixed potential $V_{cc}$. Here, the input element is a CMOS inverter stage.

FIG. 4 shows a further use of the protection structure according the invention. The protection structure 17 is used here as part of a push-pull output stage 22 of an IC. It consists of several parallel-connected transistors 18 having a resistor connected in series with its drain, the resistor being formed by the resistor region 10. The drain terminal 15 is connected to a pad 19, which is an input/output pad. The parallel-connected transistors 18 with their resistor regions 10 correspond to a protection structure as shown in FIG. 1, with several terminals connected in parallel. The terminal 12 of the drain regions of the protection structure 17 is connected through a resistor 20 to an input 23 of the internal part of the IC. The gate electrodes are driven by a signal line 24 coming from the internal part of the IC. Similarly, the gate electrodes of p-channel transistors 25 forming the second branch of the push-pull stage are driven by a signal line 26, which also comes from the internal part of the IC. As a rule, the w/l ratio of the transistors 25 of the second branch of the push-pull stage is substantially greater than the w/l ratio of the transistors 18 of the first branch.

The operation of the transistor arrangement according to the invention is as follows. If, for example, a positive voltage pulse is applied via a pin of the IC to the drain contact region connected to this pin, the n-channel MOS transistor will go into a bipolar operating state upon reaching the drain-source or drain-substrate breakdown voltage. This operating state is also called "npn state". The conductor paths 16 are typically connected to ground. The n-well 10 forms a series resistor between the drain region 2 and the drain contact region 4 of the respective transistor. It also forms a pn junction between the drain region 2 and the channel 11, the collector pn junction, which extends deep into the substrate 1. Because of the series resistance of this n-well, during the change to the bipolar state, contractions of the current occurring at the pn junction are prevented. In the bipolar state, the transistor can absorb more power than with conventional arrangements. By connecting two or more transistors in parallel, the current is distributed even further, so that the power can be absorbed by both transistors, since the dissipation is distributed over an even larger area.

It will be understood that the embodiment described herein is merely exemplary and that a person skilled in the art may make many variations and modifications without departing from the spirit and scope of the present invention. All such modifications are intended to be included within the scope of the present invention as defined in the appended claims.

What is claimed is:

1. An improved protection structure for an integrated circuit having an input element, comprising:

a semiconductor body having a top surface;

an n-channel transistor on said semiconductor body, said n-channel transistor having a drain region for coupling said protection structure to the input element of the integrated circuit, a drain contact region, a source region, and a gate region;

an n-type resistor region positioned below said drain region and said drain contact region, said n-type resistor region more lightly doped than said drain region and said drain contact region;

wherein said drain region and said drain contact region are coupled by said n-type resistor region, whereby said structure protects the integrated circuit against electrostatic discharge overloading.

2. The device as recited in claim 1, wherein said n-type resistor region extends laterally below said top surface and terminates before said gate region.

3. The device as recited in claim 1, wherein said n-type resistor region extends below all of said drain contact region.

4. The device as recited in claim 1 further comprising:

an insulating layer on said top surface of said semiconductor body, said insulating layer positioned between said drain region and said drain contact region.

5. The device as recited in claim 1, wherein said n-type resistor region is at least 10 μm wide.

6. The device as recited in claim 1, wherein said n-type resistor region is generally 100 μm wide.

7. The device as recited in claim 1, wherein said n-type resistor region has a depth 3 to 5 times a depth of said drain region and a depth of said drain contact region.

8. The device as recited in claim 1 further comprising:

an n-type source resistor region positioned below said source region, said n-type source resistor region more lightly doped than said source region.

9. The device as recited in claim 8, wherein said n-type source resistor region is at least 10 μm.

10. The device as recited in claim 8, wherein said n-type source resistor region is generally 100 μm.

11. The device as recited in claim 8, wherein said n-type source resistor region has a depth 3 to 5 times a depth of said source region.

12. The device as recited in claim 1, wherein said n-channel transistor is an n-channel MOSFET.

13. An improved protection structure for an integrated circuit having an input element, comprising:

an n-channel MOS field-effect transistor, wherein below a drain region for coupling said protection structure to the input element of the integrated circuit and a drain contact region, an n-type resistor region doped more lightly than the drain region and the drain contact region is formed to provide an electrically conductive connection between the drain region and the drain contact region, whereby said structure protects the integrated circuit against electrostatic discharge overloading.

14. The device as recited in claim 13, wherein the n-type resistor region extends laterally below said top surface and terminates before an interface where said gate region and said gate region meet.

15. The device as recited in claim 13, wherein the n-type resistor region extends below the entire drain contact region.

16. The device as recited in claim 13, wherein the drain region and the drain contact region are separated by an insulating layer located at a semiconductor surface.

17. The device as recited in claim 13, wherein the n-type resistor region is more than 10 μm wide.

18. The device as recited in claim 13, wherein the n-type resistor region is generally 100 μm wide.

19. The device as recited in claim 13, wherein the n-type resistor region has a depth that is 3 to 5 times greater than a depth of the drain region and the drain contact region.

20. The device as recited in claim 13, wherein below the source region an n-type region doped more lightly than the source region is provided.

\* \* \* \* \*